US011692266B2

(12) United States Patent
Umeta et al.

(10) Patent No.: US 11,692,266 B2
(45) Date of Patent: Jul. 4, 2023

(54) SIC CHEMICAL VAPOR DEPOSITION APPARATUS

(71) Applicant: SHOWA DENKO K.K., Tokyo (JP)

(72) Inventors: Yoshikazu Umeta, Chichibu (JP); Yoshishige Okuno, Chiba (JP); Rimpei Kindaichi, Chiba (JP)

(73) Assignee: SHOWA DENKO K.K., Tokyo (JP)

(*) Notice: Subject to any disclaimer, the term of this patent is extended or adjusted under 35 U.S.C. 154(b) by 271 days.

(21) Appl. No.: 16/717,326

(22) Filed: Dec. 17, 2019

(65) Prior Publication Data

US 2020/0199745 A1 Jun. 25, 2020

(30) Foreign Application Priority Data

Dec. 21, 2018 (JP) .................................. 2018-239879

(51) Int. Cl.
 *C23C 16/455* (2006.01)
 *C30B 25/14* (2006.01)
 (Continued)

(52) U.S. Cl.
 CPC .......... *C23C 16/455* (2013.01); *C23C 16/325* (2013.01); *C23C 16/46* (2013.01);
 (Continued)

(58) Field of Classification Search
 CPC ....... C30B 25/14; C30B 29/36; C23C 16/455; C23C 16/45519; C23C 16/325;
 (Continued)

(56) References Cited

U.S. PATENT DOCUMENTS

2003/0024901 A1\* 2/2003 Ishikawa ............. H01J 37/3244
 216/67
2005/0028732 A1\* 2/2005 Mardian ........... C23C 16/45519
 118/715
(Continued)

FOREIGN PATENT DOCUMENTS

CN 103796413 A 5/2014
JP 2002-334871 A 11/2002
(Continued)

OTHER PUBLICATIONS

Communication dated Aug. 31, 2021 from the China National Intellectual Property Administration in Chinese Application No. 201911239990.3.
(Continued)

*Primary Examiner* — Aiden Lee
(74) *Attorney, Agent, or Firm* — Sughrue Mion, PLLC (57) ABSTRACT

Provided is a SiC chemical vapor deposition apparatus including: a furnace body inside of which a growth space is formed; and a placement table which is positioned in the growth space and has a placement surface on which a SiC wafer is placed, in which the furnace body comprises a first hole which is positioned on an upper portion which faces the placement surface and through which a raw material gas is introduced into the growth space, a second hole which is positioned on a side wall of the furnace body and through which a purge gas flows into the growth space, a third hole which is positioned on the side wall of the furnace body at a lower position than the second hole and discharges the gases in the growth space, and a protrusion which is protrudes towards the growth space from a lower end of the second hole to adjust a flow of the raw material gas.

10 Claims, 4 Drawing Sheets

(51) Int. Cl.
- *C30B 25/12* (2006.01)
- *H01L 21/02* (2006.01)
- *C23C 16/32* (2006.01)
- *C23C 16/46* (2006.01)
- *C30B 29/36* (2006.01)
- *H01L 21/205* (2006.01)

(52) U.S. Cl.
CPC .............. *C30B 25/12* (2013.01); *C30B 25/14* (2013.01); *C30B 29/36* (2013.01); *H01L 21/02529* (2013.01); *H01L 21/205* (2013.01)

(58) Field of Classification Search
CPC .......... C23C 16/4401; C23C 16/45504; C23C 16/45591; H01L 21/02529; H01L 21/02378

See application file for complete search history.

(56) References Cited

U.S. PATENT DOCUMENTS

| | | | | |
|---|---|---|---|---|
| 2006/0137606 | A1* | 6/2006 | Lee | ........................ H01J 37/321 257/E21.279 |
| 2008/0026591 | A1* | 1/2008 | Kordina | ................ C30B 29/403 438/758 |
| 2014/0120731 | A1* | 5/2014 | Xu | .................... H01J 37/32633 438/710 |
| 2014/0370691 | A1 | 12/2014 | Yamada et al. | |

FOREIGN PATENT DOCUMENTS

| | | |
|---|---|---|
| JP | 2005-302848 A | 10/2005 |
| JP | 2007-294545 A | 11/2007 |
| JP | 2009-074180 A | 4/2009 |
| JP | 2013-89972 A | 5/2013 |
| JP | 2015-2209 A | 1/2015 |
| JP | 2016-050164 A | 4/2016 |
| JP | 2016-162921 A | 9/2016 |
| JP | 2018-82064 A | 5/2018 |
| TW | 201542860 A | 11/2015 |
| WO | 2016/098638 A1 | 6/2016 |

OTHER PUBLICATIONS

Office Action dated May 25, 2022 issued by the China National Intellectual Property Administration in Chinese Application No. 201911239990.3.

* cited by examiner

SIC CHEMICAL VAPOR DEPOSITION APPARATUS

BACKGROUND OF THE INVENTION

Field of the Invention

The present invention relates to a SiC chemical vapor deposition apparatus.

Priority is claimed on Japanese Patent Application No. 2018-239879, filed on Dec. 21, 2018, the content of which is incorporated herein by reference.

Description of Related Art

Silicon carbide (SiC) has characteristics in which a dielectric breakdown field is larger by one digit, a band gap is three times larger, and a thermal conductivity is approximately three times higher than those of silicon (Si). Since the silicon carbide has such characteristics, the application to a power device, a high-frequency device, and a high-temperature operating device is expected. Accordingly, in recent years, a SiC epitaxial wafer has been used in the semiconductor device described above.

The SiC epitaxial wafer is generally formed by using a SiC single crystal wafer (SiC wafer) which is processed from a bulk single crystal of SiC, which is produced by a sublimation method or the like, as a substrate on which a SiC epitaxial film is formed. Specifically, the SiC epitaxial wafer is produced by growing a SiC epitaxial film, which acts as an active region of a SiC semiconductor device, by chemical vapor deposition (CVD) on the substrate. In the specification, the SiC epitaxial wafer means a wafer which is obtained after forming the SiC epitaxial film. The SiC wafer means a wafer which is prepared before the SiC epitaxial film is formed thereon.

The performance of a SiC semiconductor device changes, when there are variations of a thickness, a composition, and a concentration of impurities to be added of a SiC epitaxial film which is obtained by growing and the like. Accordingly, it is necessary to evenly form a thin film on a body to be processed such as a SiC wafer.

In order to evenly form a thin film on a body to be processed, it is important that a raw material gas is evenly supplied to the body to be processed and generation of a deposit causing defects on a wafer is prevented. Thus, various studies have been conducted.

For example, Patent Document 1 discloses a sheet-type furnace type CVD processing apparatus which temporarily supplies a raw material gas to a processing chamber, and uniformly supplies the raw material gas into a furnace through a shower member. In addition, it is also disclosed that an introduction port which is used for introducing the raw material gas to the processing chamber is set to have a tapered shape, in order to reduce an uneven dynamic pressure of the raw material gas which is introduced into the furnace from the shower member. The introduction port having a tapered shape decreases a flow rate of the raw material gas supplied into the processing chamber and a pressure change in the processing chamber is prevented. The CVD processing apparatus (chemical vapor deposition apparatus) disclosed in Patent Document 1 can prevent a pressure change in the processing chamber.

In addition, Patent Document 2 also discloses a SiC chemical vapor deposition apparatus in which an introduction port of a gas introduction tube which introduces a raw material gas into a furnace body has a tapered shape. The gas introduction tube having a tapered shape prevents occurrence of a convective flow in the vicinity of the introduction port of the gas introduction tube, and prevents re-adhesion of deposit to a position in the vicinity of the gas introduction tube which is caused due to gas diffusion. In a case where the deposit which is re-attached to the introduction tube are peeled off and attached on a wafer, a wafer surface defect which is caused by particles may be caused. If a device is obtained by forming a layer on such a surface defect, the device is inferior. Therefore, it is necessary to prevent the wafer surface defect which is caused by particles.

PRIOR ART DOCUMENTS

Patent Documents

Patent Document 1: Japanese Unexamined Patent Application, First Publication No. 2009-74180
Patent Document 2: Japanese Unexamined Patent Application, First Publication No. 2016-50164

SUMMARY OF THE INVENTION

In the SiC chemical vapor deposition apparatuses disclosed in Patent Document 1 and Patent Document 2, a supply of a raw material gas to a body to be processed is evenly performed by preventing a convective flow of gas or an uneven dynamic pressure in a processing chamber. However, even in these cases, a flow of gas in the processing chamber still exists, it is difficult to sufficiently and evenly supply the raw material gas to a SiC wafer, and the gas may be diffused towards the periphery of side walls of the processing chamber.

The invention is made in view of such circumstances, and an object thereof is to provide a SiC chemical vapor deposition apparatus which is capable of evenly supplying a raw material gas to a SiC wafer.

As a result of intensive studies, the inventors found that a flow of a raw material gas towards a SiC epitaxial film can become a laminar flow when a protrusion is provided on a side wall of a furnace body which forms a growth space. That is, the present invention provides the following means in order to solve the problems.

(1) A SiC chemical vapor deposition apparatus according to a first aspect includes: a furnace body inside of which a growth space is formed; and a placement table which is positioned in the growth space and has a placement surface on which a SiC wafer is placed, in which the furnace body comprises a first hole which is positioned on an upper portion which faces the placement surface and through which a raw material gas is introduced into the growth space, a second hole which is positioned on a side wall of the furnace body and through which a purge gas flows into the growth space, a third hole which is positioned on the side wall of the furnace body at a lower position than the second hole and discharges the gases in the growth space, and a protrusion which protrudes towards the growth space from a lower end of the second hole to adjust a flow of the raw material gas.

The SiC chemical vapor deposition apparatus of the first aspect preferably has the following characteristics.

In addition, a combination of one or more of the following characteristics is also preferable.

(2) In the SiC chemical vapor deposition apparatus according to the aspect, the furnace body may include a first portion, a second portion, and a third portion from above, an inner diameter of the first portion may be smaller than an inner diameter of the third portion, the second portion may bond the first portion and the third portion to each other, the first hole may be positioned in the first portion, the second hole and the protrusion may be positioned in the second portion, and the third hole may be positioned in the third portion.

(3) In the SiC chemical vapor deposition apparatus according to the aspect, the protrusion may exist in a ring shape over an entire periphery of the side wall of the furnace body.

(4) In the SiC chemical vapor deposition apparatus according to the aspect, the protrusion may be parallel with the placement surface.

(5) In the SiC chemical vapor deposition apparatus according to the aspect, the protrusion may protrude from the side wall of the furnace body towards the growth space such that the protrusion is tilted obliquely upward with respect to the placement surface.

(6) In the SiC chemical vapor deposition apparatus according to the aspect, a first end of the protrusion on the growth space side may be positioned outside of an outer periphery of the SiC wafer, which is placed on the placement surface, in a plan view of the placement surface.

(7) In the SiC chemical vapor deposition apparatus according to the aspect, the second hole may be positioned over an entire periphery of the side wall of the furnace body.

According to the SiC chemical vapor deposition apparatus according to the embodiment of the invention, it is possible to evenly supply a raw material gas to a SiC wafer.

DETAILED DESCRIPTION OF THE INVENTION

Hereinafter, an example of a SiC chemical vapor deposition apparatus to which the invention is applied will be described in detail suitably with reference to the drawings.

The drawings used in the following description may be shown with enlarged characteristic parts for convenience's sake, for easy understanding of the characteristics of the invention, and dimensional ratios and the like of each constituent element may be different from actual values. In addition, the materials, the dimensions and the like shown in the following description are merely examples, the invention is not limited thereto, and these can be suitably changed within a range not changing the gist thereof. That is, the positions, the numbers, the shapes, the materials, the configurations and the like can be added, omitted, replaced, or changed within a range not departing the gist of the invention.

<SiC Chemical Vapor Deposition Apparatus>

Figure 1:
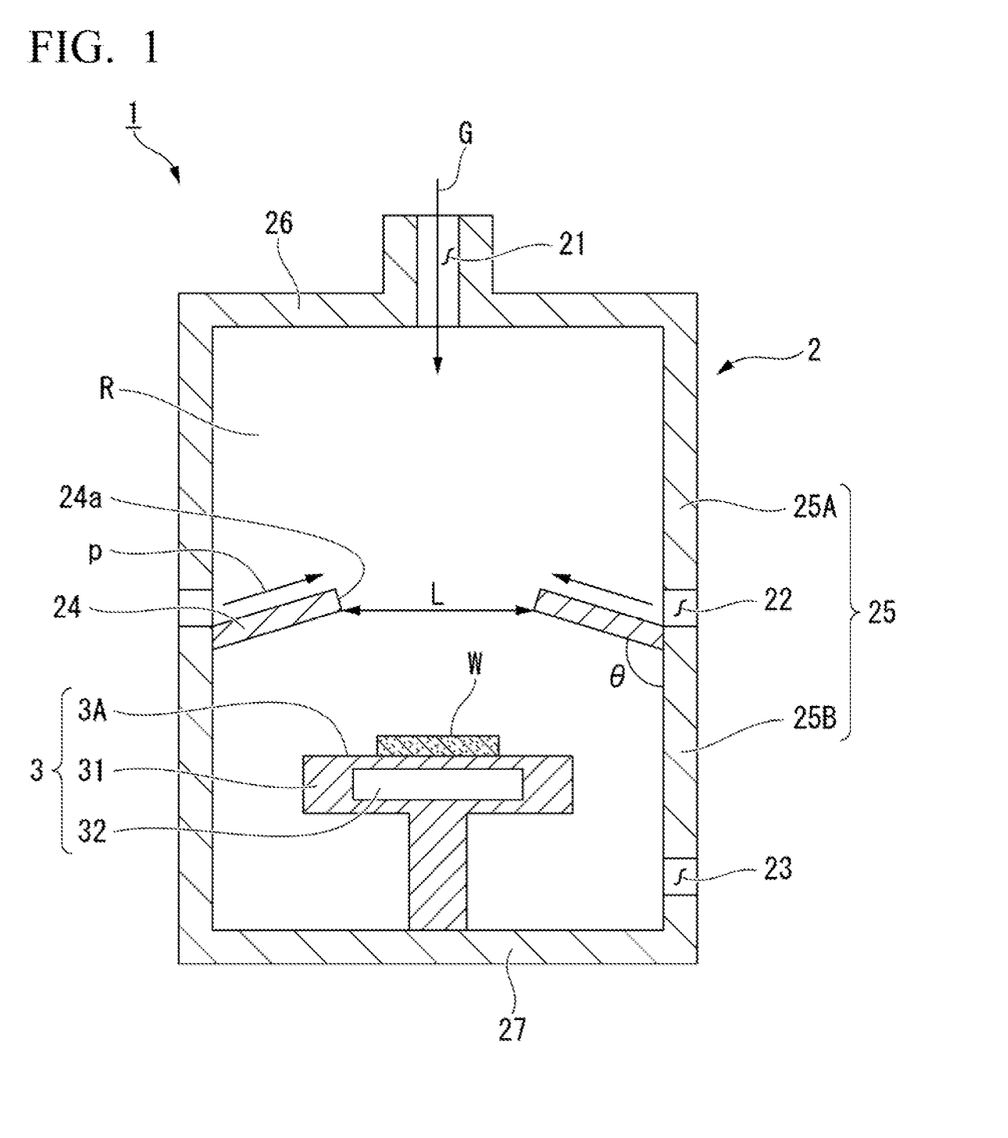
FIG. 1 is a schematic cross-sectional view of a preferred example of a SiC chemical vapor deposition apparatus according to the embodiment.

FIG. 1 is a schematic cross-sectional view of a preferred example of a SiC chemical vapor deposition apparatus 1 according to a first embodiment of the invention. The SiC chemical vapor deposition apparatus 1 according to the embodiment includes a furnace body 2 which has a growth space R therein, and a placement table 3 which is positioned in the growth space R and on which a SiC wafer W is placed.

In the embodiment, a direction in which the placement table 3 is disposed in the furnace body 2 is referred to as a downward direction, and a direction in which a first hole 21 which will be described later is positioned with respect to the placement table 3 is referred to as an upward direction.

(Placement Table)

The placement table 3 preferably includes, for example, a susceptor 31 and a heating mechanism 32. The susceptor 31 is a support of the SiC wafer W. A placement surface 3A on which the SiC wafer W can be placed is provided on the upper surface of the susceptor 31. The susceptor 31 includes a tube-like supporting shaft extending downwards. The supporting shaft is, for example, linked to a rotating mechanism (not shown). The susceptor 31 can rotate in accordance with the rotation of the supporting shaft rotated by the rotating mechanism. The heating mechanism 32 heats the SiC wafer W. The heating mechanism 32 may be provided, for example, in the susceptor 31. The heating mechanism 32 may be, for example, a heater which is positioned to face the placement surface of the SiC wafer W. The heating mechanism 32 is electrified from the outside through the inner portion of the supporting shaft.

(Furnace Body)

The furnace body 2 includes the growth space R therein. The furnace body 2 shown in FIG. 1 includes an upper portion 26, a side wall 25, and a bottom portion 27. The growth space R is a space which is surrounded by the upper portion 26, the side wall 25, and the bottom portion 27. The side wall 25 is formed of an upper side wall 25A and a lower side wall 25B. A material of the furnace body 2 is not particularly limited, and can be, for example, quartz, carbon, SiC-coated carbon and the like, which can be suitably combined.

In addition, the furnace body 2 includes a first hole 21, a second hole 22, and a third hole 23. The furnace body 2 includes a protrusion 24 which is located on a lower position of the second hole. The protrusion 24 is positioned immediately below the second hole and is positioned at a upper position than the third hole 23.

{First Hole}

The first hole 21 is located at a position facing the placement surface 3A of the placement table 3, that is, located at an upper portion than the placement surface 3A. The first hole 21 is positioned, for example, in the upper portion 26 of the furnace body 2 such as the upper surface of the furnace body 2. The number of the first hole 21 can be optionally selected, and, for example, may be one, or two or more. The first hole 21 is a raw material gas introduction portion which introduces a raw material gas G into the growth space R. The raw material gas G supplied from the first hole 21 reacts on the SiC wafer W which is placed on the placement surface 3A and forms a SiC epitaxial film on the SiC wafer W. The SiC epitaxial wafer film is produced by forming the SiC epitaxial film on the SiC wafer W. As the raw material gas G, for example, well-known Si-based gas and C-based gas can be used.

The Si-based gas is, for example, silane ($SiH_4$). In addition to this, the Si-based gas may be a gas which includes a chlorine-based Si raw material (chloride-based raw material) which includes Cl for an etching operation, such as SiH$_2$Cl$_2$, SiHCl$_3$, and/or SiCl$_4$. In addition, the Si-based gas may be, for example, a gas which is obtained by adding HCl to silane.

The C-based gas is, for example, propane (C$_3$H$_8$).

In addition, in order to control conductivity of the SiC epitaxial film which is laminated on the SiC wafer W, an impurity doping gas may be supplied when the raw material gas G is supplied. As the impurity dopant gas, N$_2$ is preferably used in a case where the conductivity type is set to n-type, and trimethylaluminum (TMA) is preferably used in a case where the conductivity type is set to p-type.

The respective Si-based gas, C-based gas and impurity doping gas may be separately and independently supplied, or may be mixed to be supplied.

An average flow rate (flow amount/cross-sectional area of first hole) of the raw material gas G which id supplied from the first hole 21 into the growth space R can be optionally selected, and is preferably 0.001 m/s to 100 m/s, more preferably 0.005 m/s to 50 m/s, and even more preferably 0.01 m/s to 10 m/s.

{Second Hole}

Figure 2:
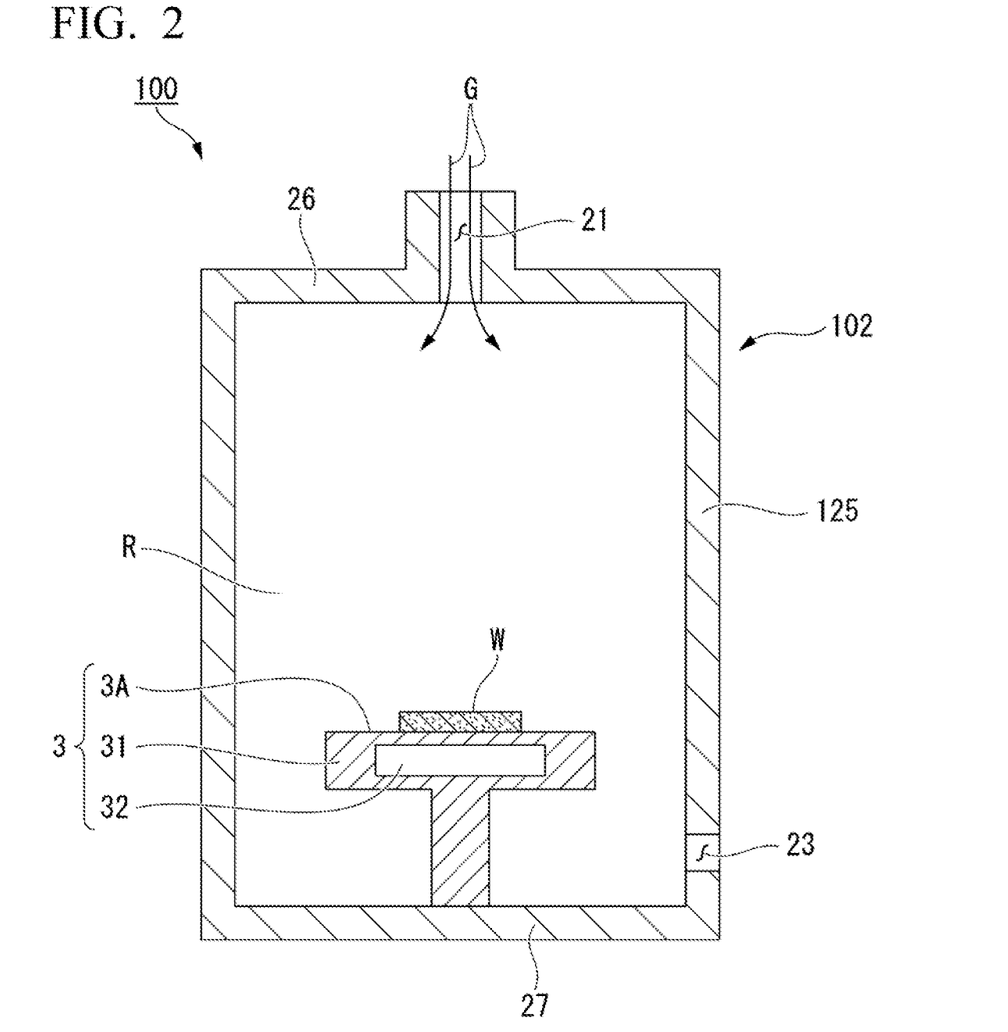
FIG. 2 is a schematic cross-sectional view of an example of a SiC chemical vapor deposition apparatus of the related art.

The second hole 22 is positioned on the side wall 25 of the furnace body 2. The second hole 22 shown in FIG. 2 is provided over the entire periphery of the side wall 25 of the furnace body 2. The second hole 22 separates the side wall 25 into the upper side wall 25A and the lower side wall 25B. The second hole 22 introduces a purge gas p into the growth space R. The second hole 22 may be continuous one ring-shaped hole or a plurality of discontinuous ring-shaped holes, in a plan view. The upper side wall 25A may be bonded to another member (not shown) which is located around the furnace body 2.

The purge gas p is a gas which does not contain Si or C. The purge gas p is, for example, an inert gas (rare gas) such as Ar or He. The purge gas p is a gas which is supplied to the surrounding of the furnace body 2 and protects a heat insulation material and a heater which are positioned around the furnace body 2. The purge gas p flows towards the growth space R from the surrounding of the furnace body 2.

{Third Hole}

The third hole 23 is positioned on the side wall 25 of the furnace body 2. The third hole 23 is positioned at a lower portion than the placement surface 3A of the placement table 3 in the furnace body 2. The third hole 23 is an exhaust port which discharges the gas in the growth space R. The third hole 23 discharges, for example, the purge gas and the unreacted gas after passing through the SiC wafer W. The third hole 23 can perform vacuum suction and can suitably adjust the pressure in the furnace body 2. The number of the third hole 23 may be one, and a plurality of the third holes may be formed in the furnace body 2 in order to increase symmetry of gas flow paths in the furnace body 2 and to increase in-plane uniformity of the epitaxial film.

{Protrusion}

The protrusion 24 is positioned on a lower end of the second hole 22. The protrusion 24 is protruded towards the growth space R from an inner surface of the side wall 25. The protrusion 24 shown in FIG. 1 is protruded obliquely upward with respect to the placement surface 3A, towards the center from the side wall 25 of the furnace body 2. In addition, the protrusion 24 shown in FIG. 1 is disposed in a ring shape over the entire periphery of the side wall 25, in a plan view. A thickness of the protrusion 24 may be constant. The protrusion 24 controls a flow of the purge gas p which flows from the second hole 22. The flow direction of the purge gas p is mainly a direction along the protrusion 24. The flow of the purge gas p includes a flow which flows upwards along the upper side wall 25A. The purge gas p controls the flow of the raw material gas G which is supplied from the first hole 21.

In addition, the protrusion 24 may not be protruded obliquely upwards with respect to the placement surface 3A, towards the growth space R from the side wall 25 of the furnace body 2. For example, the protrusion 24 may be parallel with the placement surface 3A.

Regarding the direction of the protrusion 24, an angle θ of the protrusion 24 with respect to a vertical direction is preferably 30° to 150°. The θ is more preferably 45° to 135° from a viewpoint of converging the raw material gas in the center direction. The θ is even more preferably 90° to 135° from a viewpoint of preventing the flow of the raw material gas G to the upper side wall 25A which is caused due to a convective flow.

A first end 24a of the protrusion 24 on the growth space R side is, for example, positioned on the outer side of the outer periphery of the SiC wafer W, which is placed on the placement surface 3A, in a plan view of the placement surface 3A. The first end 24a of the protrusion 24 on the growth space R side is more preferably positioned on the outer side of the placement surface 3A, in a plan view of the placement surface 3A. The raw material gas G flows towards the placement table 3 from the first hole 21. In a case where the first end 24a of the protrusion 24 is protruded on the inner side of the outer periphery of the SiC wafer W, this may cause turbulence of a flow of the raw material gas G.

A size of the protrusion 24 can be suitably selected in accordance with a size of the wafer W which is placed on the placement table 3. An inner diameter of the protrusion 24 is suitably selected, in order to preferably control the flow path of the raw material gas. When the inner diameter of the protrusion 24 is small, the raw material gas can be effectively accumulated in the center. Accordingly, a value of (inner diameter of protrusion 24)/(diameter of wafer W) can be set to be equal to or less than 4, is preferably equal to or less than 3, and more preferably equal to or less than 2. As the inner diameter of the protrusion 24 is small, the action of accumulating the gas in the center of the raw material gas can be enhanced, but it is not preferable that the inner diameter of the protrusion 24 is excessively small, because the gas is excessively accumulated in the center. Accordingly, the value of (inner diameter of protrusion 24)/(diameter of wafer W) can be equal to or more than ½, is preferably equal to or more than ¾, and more preferably equal to or more than 1. By setting the inner diameter of the protrusion 24 in the range described above, it is possible to suitably control the flow path of the raw material gas. The inner diameter of the protrusion 24 described here is a value obtained by subtracting the size of the protrusion 24 in a radial direction from the inner diameter of the furnace body and indicates a distance L shown in FIG. 1.

A SiC chemical vapor deposition apparatus 100 of the related art, which is shown in FIG. 2, includes the furnace body 2 and the placement table 3. The SiC chemical vapor deposition apparatus 100 shown in FIG. 2 is different from the SiC chemical vapor deposition apparatus 1 shown in FIG. 1, in that the second hole 22 and the protrusion 24 are not included. The other configurations are the same as those in the SiC chemical vapor deposition apparatus 1 shown in FIG. 1, the same reference numerals are used, and therefore, the description is omitted.

In the SiC chemical vapor deposition apparatus 100 shown in FIG. 2, the raw material gas G is supplied from the first hole 21. The raw material gas G is diffused from the first hole 21 towards a periphery of a side wall 125. That is, the raw material gas G has been diffused, when the raw material gas arrives at the SiC wafer W. Accordingly, the raw material gas G are not efficiently supplied to the SiC wafer W.

On the other hand, in the SiC chemical vapor deposition apparatus 1 according to the embodiment shown in FIG. 1, the purge gas p wherein the direction thereof is controlled is supplied from the second hole 22 into the growth space R. The purge gas p can converge the raw material gas to the vicinity of the center, although the purge gas p is diffused to the periphery of the side wall 125 in the SiC chemical vapor deposition apparatus 100 shown in FIG. 2.

When the raw material gas G is converged to the vicinity of the center of the growth space R, the flow of the raw material gas G is controlled in the vertical direction. In FIG. 1, in the SiC chemical vapor deposition apparatus 1, the upper portion 26 and the bottom portion 27 are disposed in parallel. Accordingly, the vertical direction is a direction orthogonal to the upper portion 26 and the bottom portion 27. That is, the flow of the raw material gas G becomes a laminar flow. When the amount of the component of the raw material gas G which is diffused towards the side wall 25 is decreased, the raw material gas G is efficiently supplied to the SiC wafer W. In addition, it is possible to uniformly supply the raw material gas G to the SiC wafer W.

In addition, since the purge gas p is an inert gas, the purge gas does not generate deposits by reacting with the raw material gas G in the furnace body 2. Accordingly, when the purge gas p flows along the side wall 25 of the furnace body 2, the generation of deposits, which are caused by the raw material gas on the side wall 25 of the furnace body 2, is prevented.

In general, in the SiC chemical vapor deposition apparatuses 1 and 100 in which the SiC wafer W is positioned on the lower portion of the furnace as shown in FIG. 1 or FIG. 2, the vicinity of the SiC wafer W has the highest temperature. As a result, a thermal gradient exists in the furnace bodies 2 and 102. Due to the thermal gradient in the furnace bodies 2 and 102, the convective flow occurs by the raw material gas G which has temporarily arrived in the vicinity of the SiC wafer W.

In the SiC chemical vapor deposition apparatus 100 shown in FIG. 2, the raw material gas G which did not contribute to the growth of the SiC epitaxial film flows to the upper portion of the side wall 125 by the convective flow. The raw material gas G is adhered to the upper portion of the side wall 125 in the furnace body 102. In the furnace body 102, the deposits are formed due to the deposition of the raw material gas G. The deposits are one reason for generation of particles on the SiC epitaxial wafer. The particles attached to the surface of the body to be processed causes a crystal defect.

The protrusion 24 also prevents the convective flow of the raw material gas G which flows upwards. Accordingly, the formation of deposits on the upper side wall 25A of the furnace body 2 is prevented. When the amount of the deposits which causes the particles is decreased, quality of the SiC epitaxial wafer is improved.

An average flow rate of the purge gas flowing into the growth space R is optionally selected and a value of (flow amount/cross-sectional area of second hole) is, for example, 0.1 m/s to 100 m/s. The average flow rate of the purge gas p is preferably 0.2 m/s to 50 m/s and more preferably 0.5 m/s to 30 m/s.

In the SiC chemical vapor deposition apparatus 1 according to the embodiment, the inert purge gas p in which the direction thereof is controlled by the protrusion 24 controls the flow of the raw material gas G. Therefore, it is possible to efficiently supply the raw material gas G to the SiC wafer W. In addition, the purge gas p also prevents the adhesion of deposits on the upper side wall 25A.

Hereinabove, the first embodiment has been described in detail, but the SiC chemical vapor deposition apparatus according to the first embodiment is not limited to the examples, and various modifications and changes can be performed within a range of the gist of the invention.

For example, the second hole 22 may be a continuous opening over the entire periphery of the side wall 25 of the furnace body 2 or may be a plurality of openings which are not bonded to each other. In a case where the second hole 22 is the continuous opening located over the entire periphery of the side wall 25 of the furnace body 2, for example, the upper portion (combination of the upper portion 26 and the upper side wall 25A) of the furnace body 2 is suspended by a support member (not shown), and the lower portion (combination of the lower side wall 25B and the bottom portion 27) of the furnace body 2 may be placed on a placement member (not shown). In this way, the upper portion and the lower portion of the furnace body 2 may be held at a constant interval. In a case where the second hole 22 is provided as a plurality of openings, the number of the second holes 22 which introduce the purge gas p is not particularly limited, and a large number thereof is preferable.

Hereinafter, an example in which the second hole 22 is a plurality of openings will be described. In addition, the second holes 22 are preferably positioned at regular intervals from a viewpoint of symmetry of gas flow paths.

A size or a shape of the second hole 22 is not particularly limited, and for example, an opening shape in a side view may be a square, a substantially square, a rectangular, a circle or the like. The second holes 22 can be provided at regular intervals or with the predetermined disposition, and can be, for example, disposed in a ring shape in a plan view. The second holes 22 may have discontinuous ring shape in a plan view. The shape thereof may be a ring-shaped hole in which a height in the vertical direction from the outside to the inside of the furnace changes and the upper surface and the lower surface are curved surfaces. The height of the second hole 22 can be, for example, equal to or more than 1 mm. The height thereof is preferably equal to or more than 1.5 mm and even more preferably equal to or more than 2 mm. In addition, the height of the second hole 22 may be, for example, equal to or less than 100 mm. The height thereof is more preferably equal to or less than 50 mm and even more preferably equal to or less than 30 mm. When the second holes 22 are disposed in a ring shape, a width and/or a length of the ring can be suitably selected. In addition, an opening ratio of the second hole 22 in a circumferential direction may be 1 (100%), and it is preferable that the opening ratio is closed to 1. The opening ratio of the second hole 22 in a circumferential direction is set to be equal to or more than 0.3 in order to control the flow of the raw material gas G. Here, the opening ratio of the second hole 22 in a circumferential direction means an opening ratio of the furnace body 2 in a vertical direction at a height of the furnace body 2 at which the second holes 22 are positioned. For example, in a case where the heights of the second holes are the same, the opening ratio of 1 means that the second hole is opened over the entire periphery thereof, and the opening ratio of 0.5 means that the holes are opened with the volume of 50%, compared to that of the second hole which has the opening ratio of 1.

The height at which the second hole 22 is positioned is preferably positioned at a position which is higher than the placement surface 3A.

The protrusion 24 may not be a continuous ring-shaped member which extends over the side wall 25. The protrusion 24 may be a plurality of members which are disposed under the second hole(s) 22. In a case where the protrusion 24 exists over the entire periphery of the side wall 25, the raw material gas G can be converged towards the center of the furnace body 2 at any position in a circumferential direction in the furnace body 2, and flowing-up of the raw material gas G to the upper side wall 25A can be prevented.

When the protrusion 24 is formed of a plurality of members, the number of the protrusion 24 is not particularly limited, and a large number thereof is preferable. The plurality of members may be disposed at the same height on the side wall 25.

Second Embodiment

Figure 3:
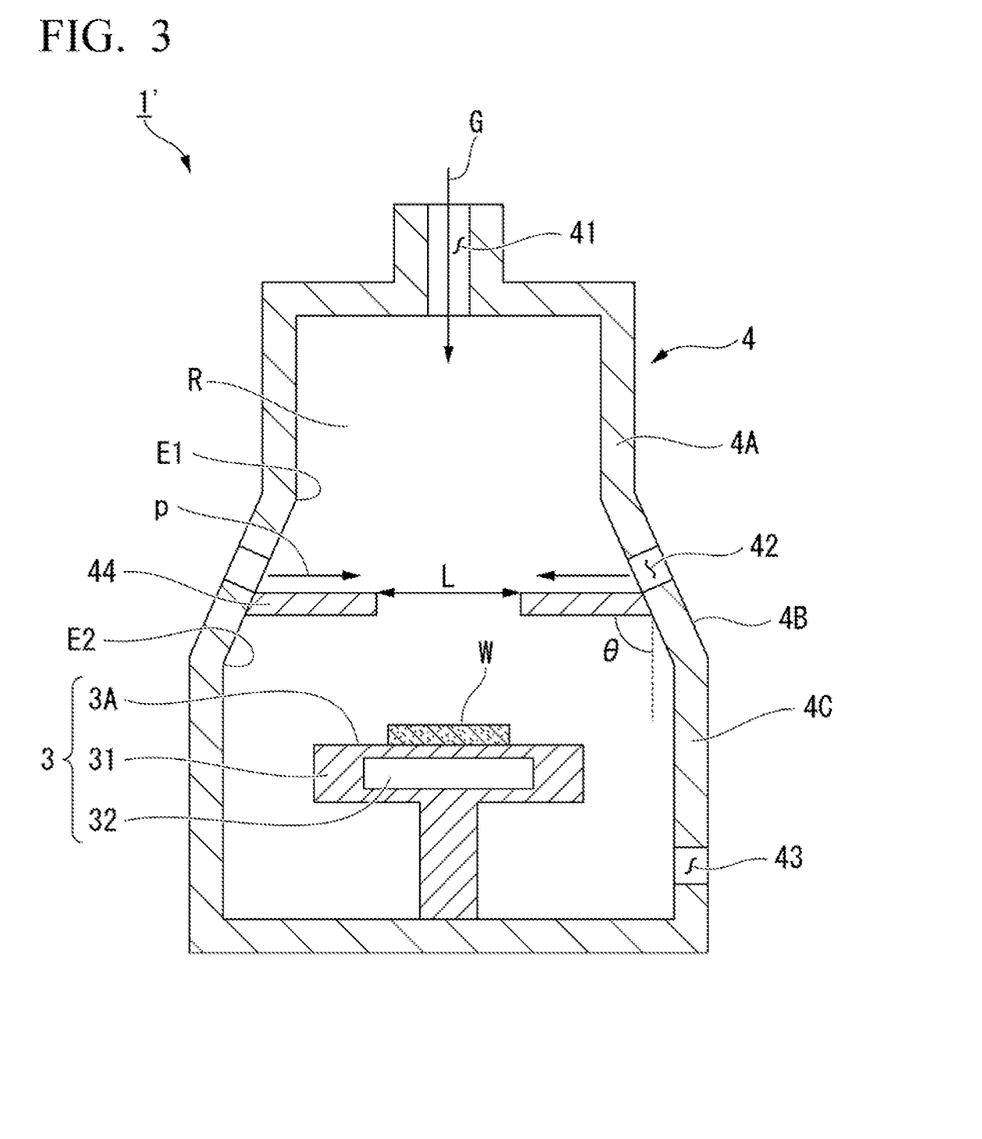
FIG. 3 is a schematic cross-sectional view of another preferred example of the SiC chemical vapor deposition apparatus according to the embodiment.

FIG. 3 is a schematic cross-sectional view of a preferred example of a SiC chemical vapor deposition apparatus 1' according to a second embodiment. A structure of a furnace body 4 of the SiC chemical vapor deposition apparatus 1' according to the second embodiment is different from that of the SiC chemical vapor deposition apparatus 1 according to the first embodiment. The other configurations are the same and the same reference numerals are used, and therefore, the description thereof is omitted.

The furnace body 4 of the SiC chemical vapor deposition apparatus 1' shown in FIG. 3 includes a first portion 4A, a second portion 4B, and a third portion 4C in order from the top. An inner diameter of the first portion 4A is smaller than an inner diameter of the third portion 4C. Here, the "inner diameter" means a diameter of an inner surface of the furnace body 4 on the growth space R side in a case where the furnace body 4 is cut in a horizontal direction. The second portion 4B is a portion connecting the first portion 4A and the third portion 4C to each other. Corners E1 and E2 are respectively formed on a connection point between the first portion 4A and the second portion 4B and a connection point between the second portion 4B and the third portion 4C. The corner E1 protruded towards inside of the growth space R is a portion to which the deposits are easily attached.

In addition, the furnace body 4 includes a first hole 41, a second hole 42, a third hole 43, and a protrusion 44. The raw material gas G is supplied from the first hole 41, the purge gas p is supplied from the second hole 42, and the gas included in the growth space R is discharged from the third hole 43. The first hole 41 is positioned at the first portion 4A, the second hole 42 is positioned at the second portion 4B, and the third hole 43 is positioned at the third portion 4C. When the inner diameter of the first portion 4A of the furnace body 4 is smaller than the inner diameter of the third portion 4C, the raw material gas G is hardly diffused in the vicinity of the first portion. Accordingly, in the furnace body 4, the raw material gas is easily converged in the vicinity of the center. In addition, in the furnace body 4, the amount of the raw material gas which flows upwards due to the convective flow can be prevented.

The purge gas p flows from the second hole 42. The direction of the purge gas p is controlled by the protrusion 44 and the raw material gas G which flows upwards can be prevented. As described above, the corner E1 is a portion to which deposits are easily attached. The peeling of the deposits which are attached to the portion causes particles. When the amount of the deposits which cause the particles is decreased, quality of the SiC epitaxial wafer is improved.

The specific configurations of the first hole 41, the second hole 42, the third hole 43, and the protrusion 44 in the furnace body 4 can be the same as those of the first hole 21, the second hole 22, the third hole 23, and the protrusion 24 of the furnace body 2. The direction of the protrusion 44 is the same as the configuration of the protrusion 24.

That is, an angle θ of the protrusion 44 to a vertical direction is the same as the angle θ of the protrusion 24 to the vertical direction.

EXAMPLES

Example 1

The SiC chemical vapor deposition apparatus 1' having the configuration shown in FIG. 3 was reproduced by simulation, and a growth speed of the SiC epitaxial film was obtained. In the simulation, Fluent manufactured by ANSYS Inc. was used. It was confirmed that the simulation has high correlation with an actual experimental result.

Specific conditions of the simulation were as follows.

Temperature of furnace body 2: the maximum temperature is equal to or higher than 1400° C.

Temperature of wafer W: approximately 1600° C.

Flow amount of purge gas p/flow amount of raw material gas G: 1.3

Maximum flow rate of raw material gas: approximately 20 m/s

Protrusion direction of protrusion 44: parallel with the placement surface 3A of the placement table 3

Diameter of wafer W: 200 mm

Inner diameter L of protrusion 44/wafer diameter: 1.4

Internal radius of protrusion/Height of protrusion 44 in vertical direction from the placement table 3: 4.2

Opening ratio of second hole 22 in circumferential direction: 100%

Comparative Example 1

Comparative Example 1 is different from Example 1 in that the protrusion 44 is not provided. The other conditions are the same as those in Example 1.

Figure 4:
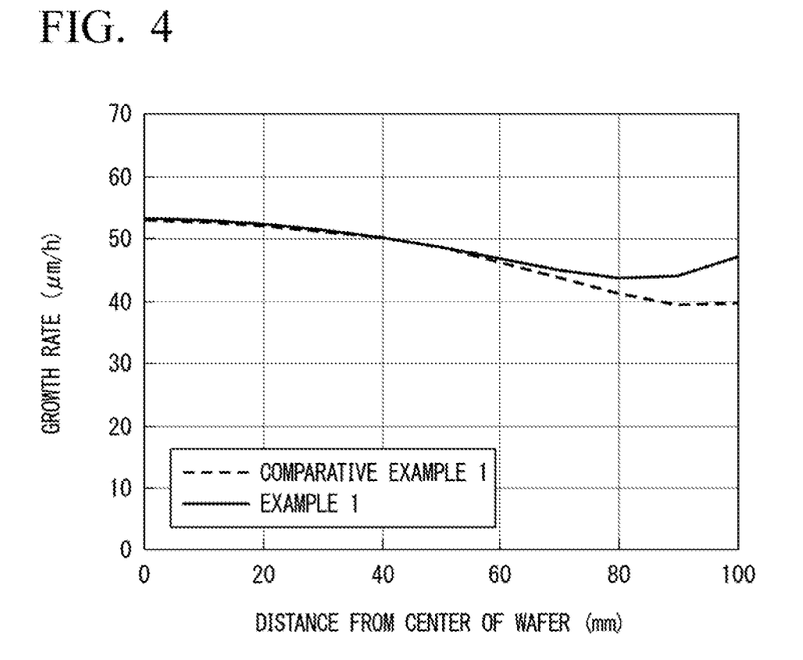
FIG. 4 is a graph showing an in-plane growth speed of a SiC epitaxial film in SiC chemical vapor deposition apparatuses of Example 1 and Comparative Example 1.

FIG. 4 is a graph showing an in-plane growth speed when the SiC epitaxial wafer is grown under the conditions of Example 1 and Comparative Example 1. A horizontal axis is a distance of a measurement point from the center of the SiC wafer W, and a vertical axis is a growth speed of the SiC epitaxial film at the measurement point. As shown in FIG. 4, in a case of Comparative Example 1, the growth speed of the SiC epitaxial film becomes slow on the outside of the SiC wafer W. On the other hand, in Example 1, the growth speed of the SiC epitaxial film becomes substantially even in the plane of the SiC wafer W. An index of the evenness of the SiC epitaxial film is, for example, a numerical value obtained by 100×{100−(minimum value of growth speed)}/(maximum value of growth speed). As this numerical value is low, the evenness of the SiC epitaxial film is high. In Example 1 and Comparative Example 1, this value is respectively 17.9(%) and 25.5(%), as a calculation result with respect to a wafer having a radius of 100 mm. From this result, it can be said that the evenness of the SiC epitaxial film is higher under the conditions of Example 1, compared to that under the conditions of Comparative Example 1. That is, the protrusion 44 contributes to the improvement of carrier concentration evenness of the SiC epitaxial film and efficient growth of the SiC epitaxial film.

As described above, since the SiC chemical vapor deposition apparatus according to the invention includes the hole(s) which supply the purge gas to the side wall of the furnace body, and the protrusion which adjusts the gas flow path in the furnace body, the SiC chemical vapor deposition apparatus is useful in the producing of a high-quality SiC epitaxial wafer in which in-plane carrier concentration evenness of wafer is high.

The present invention can provide a SiC chemical vapor deposition apparatus which is capable of evenly supplying a raw material gas to a SiC wafer which is placed on a placement table.

EXPLANATION OF REFERENCES 1, 1', 100: SiC chemical vapor deposition apparatus
2, 4, 102: furnace body
4A: first portion
4B: second portion
4C: third portion
3: placement table
3A: placement surface
31: susceptor
32: heating mechanism
21, 41: first hole
22, 42: second hole
23, 43: third hole
24, 44: protrusion
24a: first end on growth space side
25, 125: side wall
25A: upper side wall
25B: lower side wall
26: upper portion
27: bottom portion
L: inner diameter of protrusion
R: growth space
W: SiC wafer (wafer)
G: raw material gas
p: purge gas
E1, E2: corner

The invention claimed is:

1. A SiC chemical vapor deposition apparatus comprising:
a furnace body inside of which a growth space is formed;
a placement table which is positioned in the growth space and has a placement surface on which a SiC wafer is placed; and
two gas supply sources connected to the furnace body, wherein the two gas supply sources are a raw material gas supply source and an inert gas supply source,
wherein the furnace body comprises
a first hole which is positioned on an upper portion which faces the placement surface, wherein the first hole is connected with the raw material gas supply source to supply a raw material gas and generate a SiC epitaxial film in the growth space,
a second hole which is positioned on a side wall of the furnace body, wherein the second hole is not connected with the raw material gas supply source but is connected with the inert gas supply source to supply an inert gas,
a third hole which is positioned on the side wall of the furnace body at a lower position than the second hole and discharges the gases included in the growth space, and
a protrusion which protrudes towards the growth space from a lower end of the second hole to adjust a flow of the raw material gas,
wherein
a flow direction of the inert gas which is supplied from the second hole is mainly a direction along the protrusion, and
a flow of the inert gas includes a flow which flows upwards along the side wall to prevent generation of deposits which are caused on the side wall by the raw material gas, and
wherein the furnace body includes a first portion, a second portion, and a third portion from above,
an inner diameter of the first portion is smaller than an inner diameter of the third portion,
the second portion bonds the first portion and the third portion to each other,
the first hole is positioned in the first portion,
the second hole and the protrusion are positioned in the second portion, and
the third hole is positioned in the third portion, and
wherein the lower end of the second hole directly connects to an upper surface of the protrusion.

2. The SiC chemical vapor deposition apparatus according to claim 1,
wherein the protrusion exists in a ring shape over an entire periphery of the side wall of the furnace body.

3. The SiC chemical vapor deposition apparatus according to claim 1,
wherein the protrusion is parallel with the placement surface.

4. The SiC chemical vapor deposition apparatus according to claim 1,
wherein the protrusion protrudes from the side wall of the furnace body towards the growth space such that the protrusion is tilted obliquely upward with respect to the placement surface.

5. The SiC chemical vapor deposition apparatus according to claim 1,
wherein a first end of the protrusion on a growth space side is positioned outside of an outer periphery of the SiC wafer, which is placed on the placement surface, in a plan view of the placement surface.

6. The SiC chemical vapor deposition apparatus according to claim 1,
wherein the second hole is positioned over an entire periphery of the side wall of the furnace body.

7. The SiC chemical vapor deposition apparatus according to claim 1,
wherein the second hole is positioned higher than the placement surface of the placement table in the furnace body.

8. The SiC chemical vapor deposition apparatus according to claim 1,
wherein the third hole is positioned at a lower portion than the placement surface of the placement table in the furnace body.

9. The SiC chemical vapor deposition apparatus according to claim 1,
wherein an angle of the protrusion with respect to a vertical direction is 30° to 150°.

10. The SiC chemical vapor deposition apparatus according to claim 1,
wherein an angle of the protrusion with respect to a vertical direction is 90° to 150°.

* * * * *